(12) United States Patent
Chuang et al.

(10) Patent No.: US 12,388,041 B2
(45) Date of Patent: Aug. 12, 2025

(54) SEMICONDUCTOR PACKAGE

(71) Applicant: Taiwan Semiconductor Manufacturing Company, Ltd., Hsinchu (TW)

(72) Inventors: Kris Lipu Chuang, Hsinchu (TW); Hsiu-Jen Lin, Hsinchu County (TW); Tzu-Sung Huang, Tainan (TW); Hsin-Yu Pan, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 631 days.

(21) Appl. No.: 17/741,463

(22) Filed: May 11, 2022

(65) Prior Publication Data

US 2023/0369263 A1  Nov. 16, 2023

(51) Int. Cl.
| H01L 23/00 | (2006.01) |
| H01L 23/31 | (2006.01) |
| H01L 23/36 | (2006.01) |
| H01L 23/538 | (2006.01) |
| H01L 21/683 | (2006.01) |
| H01L 23/498 | (2006.01) |
| H01L 25/10 | (2006.01) |

(52) U.S. Cl.
CPC .......... *H01L 24/20* (2013.01); *H01L 23/3128* (2013.01); *H01L 23/36* (2013.01); *H01L 23/5386* (2013.01); *H01L 23/5389* (2013.01); *H01L 24/06* (2013.01); *H01L 21/6835* (2013.01); *H01L 23/49816* (2013.01); *H01L 24/19* (2013.01); *H01L 25/105* (2013.01);
(Continued)

(58) Field of Classification Search
CPC ............. H01L 21/4853; H01L 21/4857; H01L 21/565; H01L 21/568; H01L 21/6835; H01L 23/49827; H01L 23/5383; H01L 23/5386; H01L 23/5389; H01L 24/06; H01L 25/105; H01L 23/49816; H01L 2221/68359; H01L 25/04; H01L 25/0657; H01L 25/50; H01L 24/19; H01L 24/32; H01L 24/08; H01L 2224/06519; H01L 2224/214; H01L 2224/2201; H01L 2224/28105; H01L 2225/06548; H01L 2225/1035; H01L 2225/1058; H01L 2225/1094; H01L 2225/06527; H01L 2221/68345; H01L 2221/68372; H01L 2221/68381; H01L 2225/06513; H01L 2225/06517

See application file for complete search history.

(56) References Cited

U.S. PATENT DOCUMENTS 9,000,584 B2  4/2015 Lin et al.
9,048,222 B2  6/2015 Hung et al.
(Continued)

*Primary Examiner* — Eliseo Ramos Feliciano
*Assistant Examiner* — Brad A Knudson
(74) *Attorney, Agent, or Firm* — JCIPRNET

(57) ABSTRACT

A semiconductor package includes a substrate, a redistribution circuit layer, and a protective layer. The redistribution circuit layer is over the substrate and includes a plurality of functional pads electrically connected to the substrate, and a dummy pad pattern electrically disconnected from the plurality of functional pads, wherein the dummy pad pattern includes a plurality of pad portions connected to one another. The protective layer is disposed over the redistribution circuit layer and comprising a plurality of first openings spaced apart from one another and respectively revealing the plurality of pad portions.

20 Claims, 15 Drawing Sheets

(52) U.S. Cl.
CPC ............ *H01L 2221/68359* (2013.01); *H01L 2224/06519* (2013.01); *H01L 2224/214* (2013.01); *H01L 2224/2201* (2013.01); *H01L 2224/28105* (2013.01); *H01L 2225/06548* (2013.01); *H01L 2225/1035* (2013.01); *H01L 2225/1058* (2013.01); *H01L 2225/1094* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0261557 A1* | 9/2018 | Yu .................. H01L 23/562 |
| 2019/0148262 A1* | 5/2019 | Pei .................. H01L 25/105 257/713 |
| 2020/0273806 A1* | 8/2020 | Chiang ............ H01L 21/56 |
| 2023/0058497 A1* | 2/2023 | Suk ................. H01L 23/49822 |
| 2023/0121888 A1* | 4/2023 | Kim ................. H01L 24/05 257/686 |
| 2023/0178451 A1* | 6/2023 | Lin ................. H01L 23/5385 257/712 |

* cited by examiner

SEMICONDUCTOR PACKAGE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
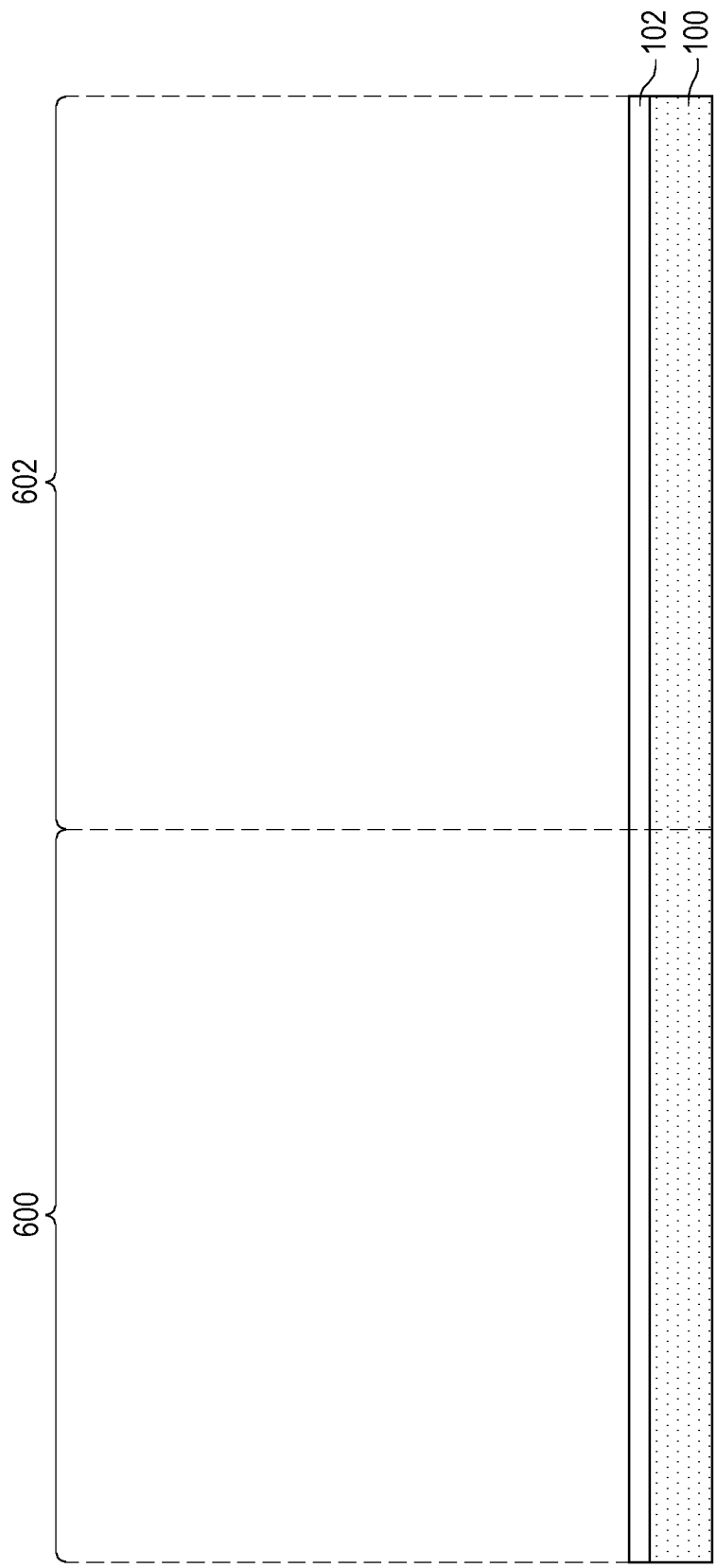
FIG. 1 to FIG. 11 illustrate partial cross sectional views of intermediate stages in the manufacturing of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a semiconductor package (e.g., a package on package (PoP) structure) having dummy connectors disposed between a first package and a second package component. In some embodiment, the second package component may be a memory package (e.g., having one or more dynamic random access memory (DRAM) dies), which is physically and electrically coupled to the first package component (e.g., an integrated fan-out (InFO) package having a logic die and redistribution structures) using functional connectors. The dummy connectors may be physically and/or electrically disconnected from functional circuits of the first package component (e.g., the logic die and the redistribution structures). In some embodiments, the dummy connectors may also be electrically disconnected from functional circuits of the second package component.

Accordingly, the redistribution structure of the first package component may include corresponding dummy pads for connecting the dummy connectors. The dummy pads may also be used to provide a uniform metal distribution within the redistribution structure and homogenize the density of metal features in the package component, preventing irregularities in the surface. Thus, subsequent structures are formed on a uniform and planar surface. However, dummy pads are isolated from other functional conductive features such as functional pads, functional circuits, etc., so heat is harder to dissipate during thermal process such as laser drilling process, or the like. Hence, in some embodiments, a plurality of dummy pads can be connected to one another to be integrated into single dummy pad pattern for improving heat dissipation efficiency.

It is noted that the teachings of this disclosure are applicable to any package structure including functional connectors bonding two package components. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIG. 1 to FIG. 11 illustrate partial cross sectional views of intermediate stages in the manufacturing of a semiconductor package according to some embodiments of the present disclosure. FIG. 1 illustrates a carrier substrate 100 and a release layer 102 formed over the carrier substrate 100. In some embodiments, a plurality of package regions 600 and 602 for the formation of a plurality of packages respectively, are illustrated. The number of the package regions are merely for illustration and is not limited in the disclosure.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be a ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
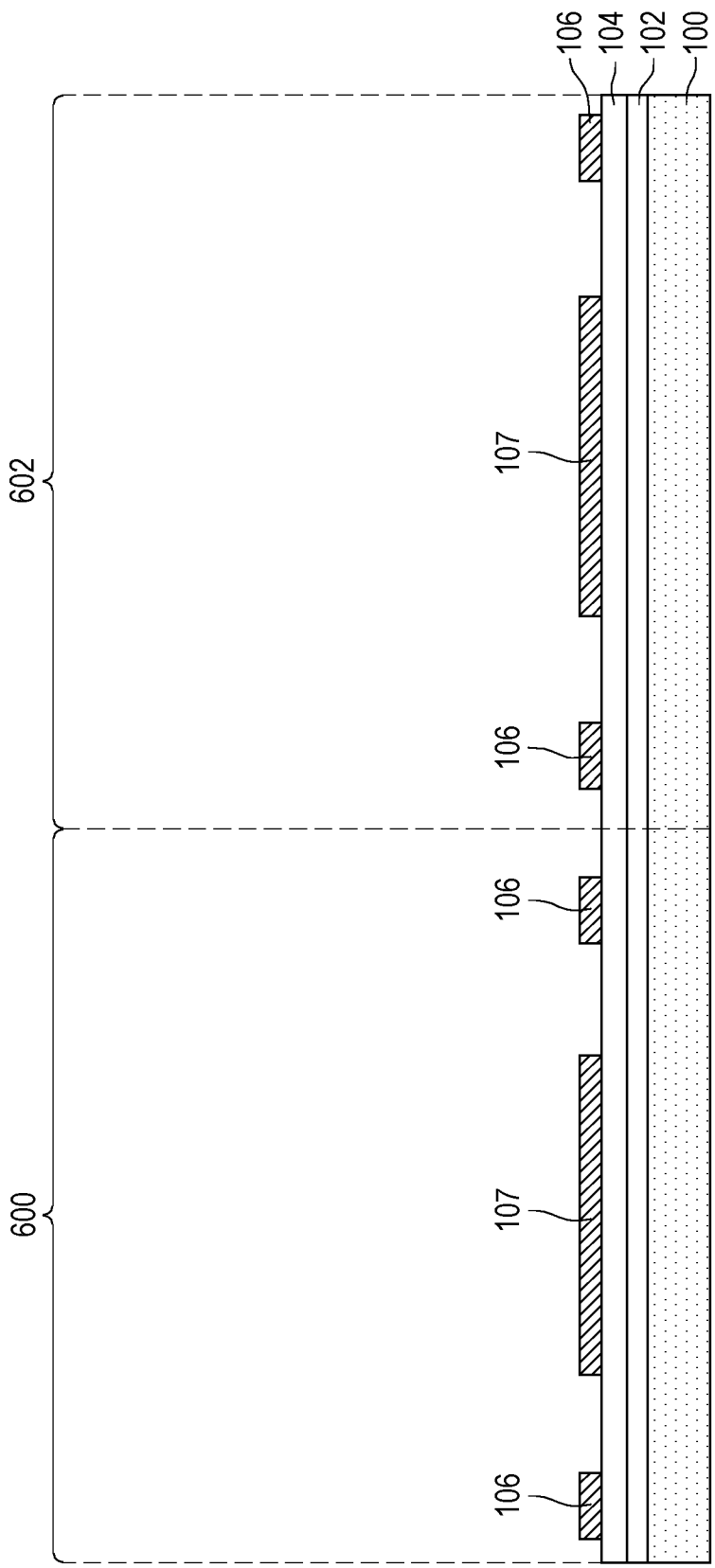

Referring to FIG. 2, a protective layer 104 and a redistribution circuit layer including functional pads 106 and dummy pad pattern 107 are formed. As illustrated in FIG. 2, a protective layer 104 is formed on the release layer 102. The bottom surface of the protective layer 104 may be in contact with the top surface of the release layer 102. In some embodiments, the protective layer 104 is formed of a polymer, which may be a photo-sensitive material such as polybenzoxazole (PBO), polyimide, benzocyclobutene (BCB), or the like, that may be patterned using a lithography mask. In other embodiments, the protective layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The protective layer 104 may be formed by any acceptable deposition process, such as spin coating, chemical vapor deposition (CVD), laminating, sputtering, the like, or a combination thereof.

In some embodiments, the redistribution circuit layer 106, 107 is formed over the protective layer 104. As an example to form redistribution circuit layer, a seed layer (not shown) is formed over the protective layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the redistribution circuit layer 106, 107.

In some embodiments, referring to as illustrated in FIG. 2, the redistribution circuit layer includes a plurality of functional pads 106 and at least one dummy pad pattern 107 electrically disconnected from the functional pads 106. In some embodiments, the dummy pad pattern 107 is floating. The dummy pad pattern 107 are configured to provide a mounting point for subsequent formation of dummy connectors (e.g., dummy connectors 316 shown in FIG. 11. One of the examples of a top view of the redistribution circuit layer is illustrated in FIG. 12. In the present embodiment, a plurality of circular dummy pads are merged into one dummy pad pattern 107 as shown in regions A1, A3 in FIG. 12. In other words, a plurality of circular dummy pad portions are connected to one another by connecting portions to form the dummy pad pattern 107. Accordingly, a size (e.g., footprint) of the dummy pad pattern 107 may be substantially greater than a size (e.g., footprint) of one of the functional pads 106. More details on the dummy pad pattern 107 are described later in the disclosure.

Figure 3:
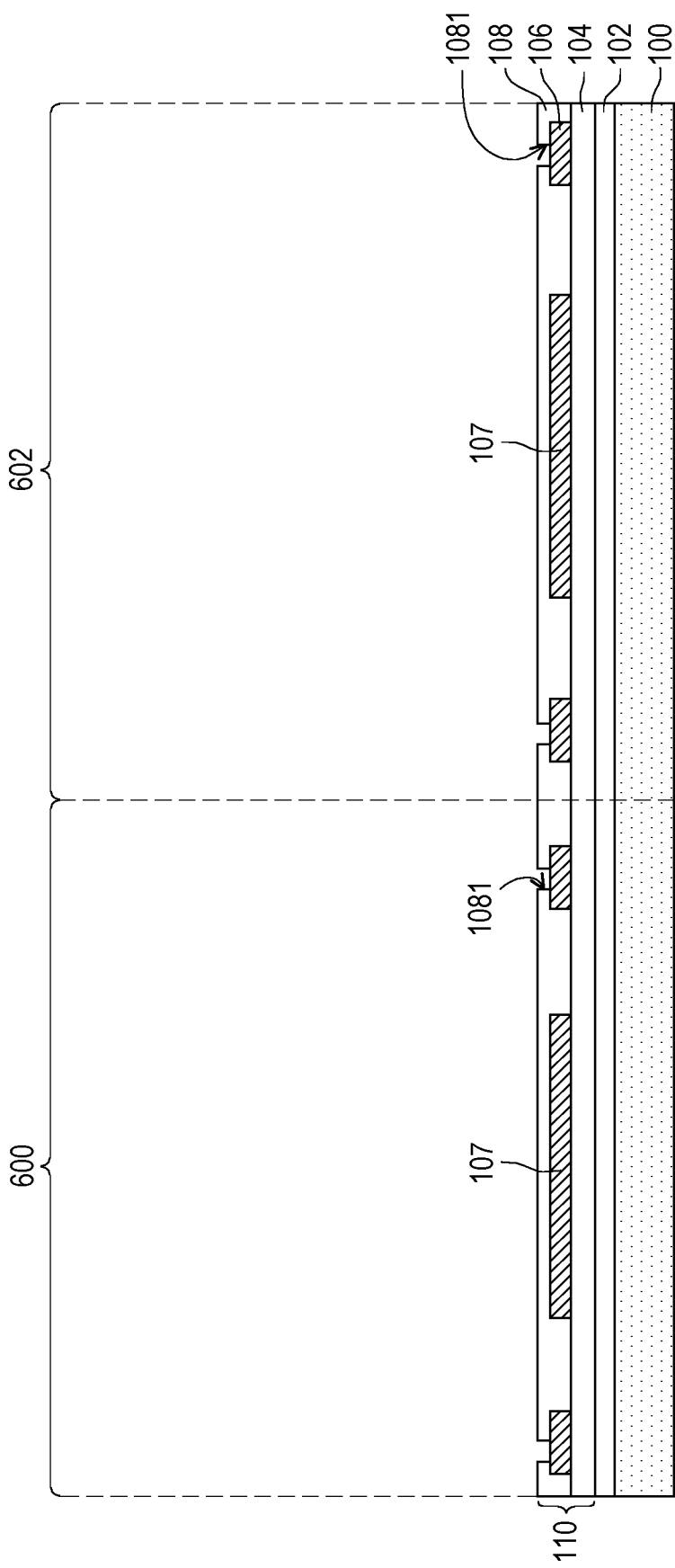

Referring to FIG. 3, a dielectric layer 108 is formed on the redistribution circuit layer 106, 107 and the protective layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings 1081 to reveals the functional pads 106 respectively for electrical connection. The patterning may be by an acceptable process, such as by exposing the dielectric layer 108 to light when the dielectric layer is a photo-sensitive material or by etching using, for example, an anisotropic etch. In the current embodiments, the dielectric layer 108 covers the dummy pad pattern 107. In an alternative embodiment, the dielectric layer 108 may further include openings for exposing a part of the dummy pad pattern 107.

The dielectric layers 104 and 108 and the redistribution circuit layer 106, 107 may be referred to as a backside redistribution structure 110. As illustrated, the backside redistribution structure 110 includes the two dielectric layers 104 and 108 and one redistribution circuit layer 106, 107. In other embodiments, the back-side redistribution structure 110 can include any number of dielectric layers, redistribution circuit layers, and vias. One or more additional redistribution circuit layer and dielectric layer may be formed in the backside redistribution structure 110 by repeating the processes for forming a redistribution circuit layer and dielectric layer. Vias may be formed during the formation of a metallization pattern by forming the seed layer and conductive material of the metallization pattern in the opening of the underlying dielectric layer. The vias may therefore interconnect and electrically couple the various metallization patterns. The redistribution circuit layer including the functional pads 106 and the dummy pads 107 are formed as the first (outermost) metallization layer of the backside redistribution structure 110.

Figure 4:
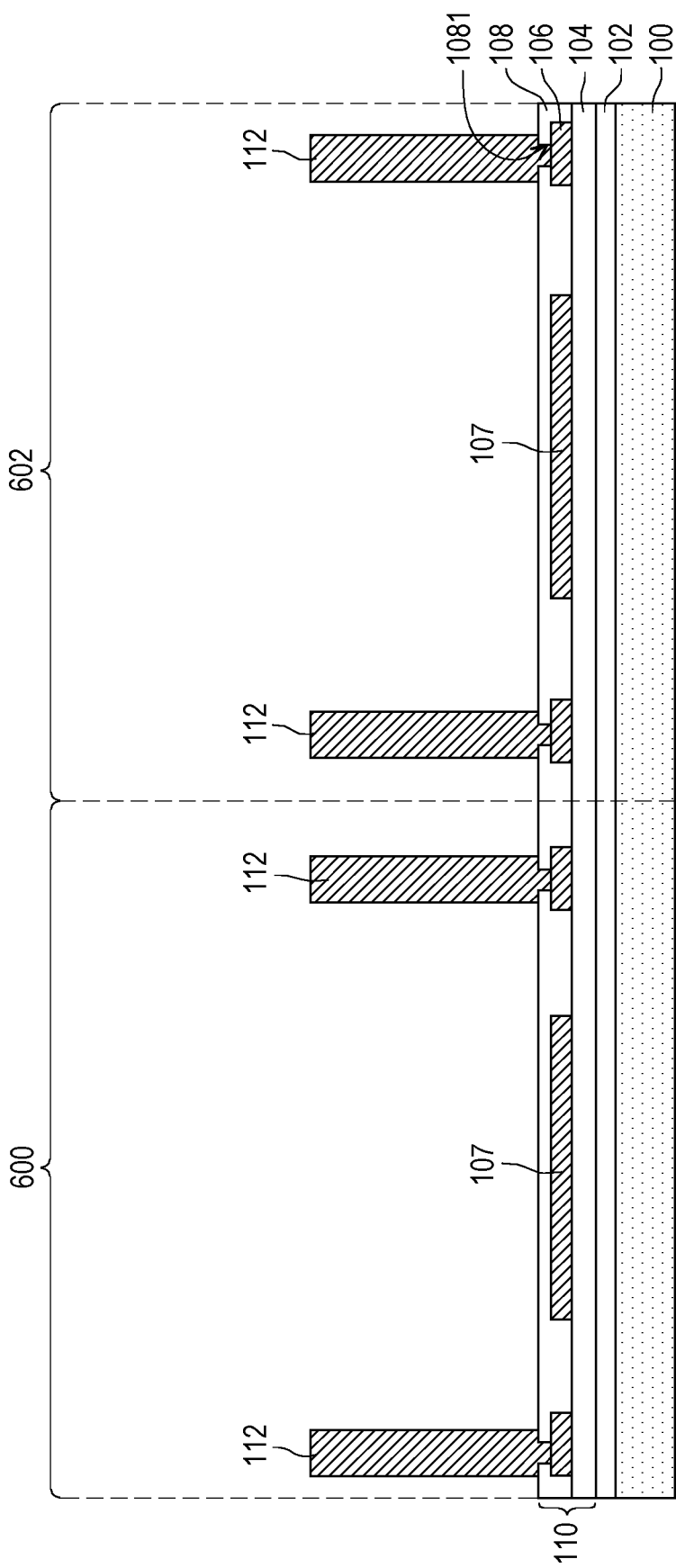

With now reference to FIG. 4, a plurality of through vias 112 are formed. As an example to form the through vias 112, a seed layer is formed over the back-side redistribution structure 110, e.g., the dielectric layer 108 and the functional pads 106 exposed by the openings 1081 of the dielectric layer 108 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112. In some embodiments, the through vias 112 are functional through vias which are electrically connected to the functional pads 106. In the embodiment of the dielectric layer 108 exposing a part of the dummy pad pattern 107, at least one dummy through via (e.g., dummy through via 113 shown in FIG. 12 and FIG. 16) may be formed on the part of the dummy pad pattern 107 that is exposed by the dielectric layer 108. As illustrated in FIG. 12, the position of the dummy through via 113 at least partially overlap with the dummy pad pattern 107 from a top view.

Figure 5:
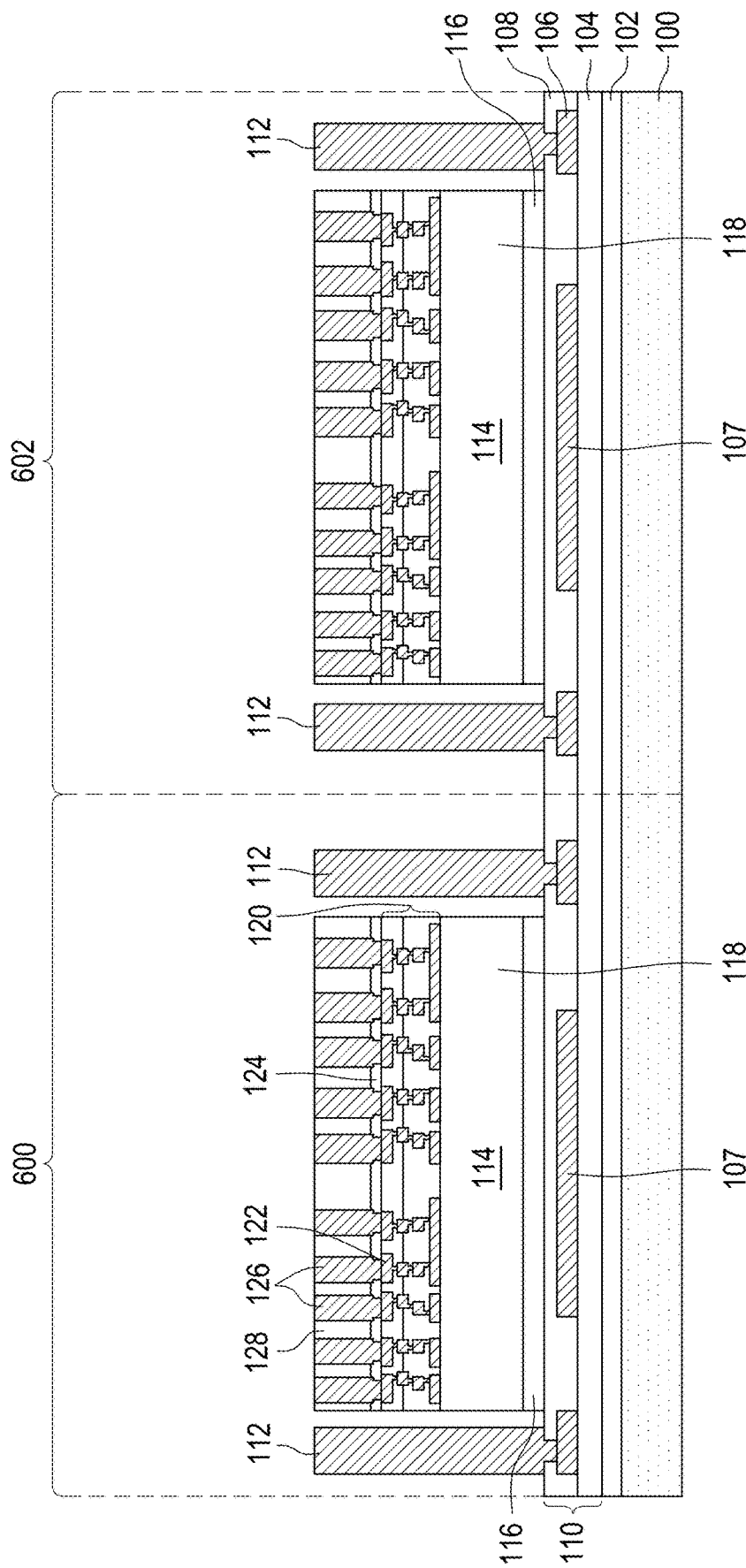

Referring to FIG.-4 5, a plurality of integrated circuit dies 114 are adhered to the dielectric layer 108 by an adhesive 116. As illustrated in FIG.-4 5 one integrated circuit die 114 is adhered in each of the package regions 600 and 602, and in other embodiments, more integrated circuit dies 114 may be adhered in each region. For example, in an embodiment, two integrated circuit dies 114 may be adhered in each region. The integrated circuit die 114 may be a logic die (e.g., central processing unit, microcontroller, etc.), or the like. In some embodiments, the die 114 is a system on chip (SOC) that integrates all electronic components into a single die. In some embodiments, the die 114 may a die, a chip or a package. In some embodiments, the die 114 includes any one of various known types of semiconductor devices such as a memory die (e.g., dynamic random access memory (DRAM) die, static random access memory (SRAM) die, etc.), application-specific integrated circuit (ASIC) die, power management die (e.g., power management integrated circuit (PMIC) die), radio frequency (RF) die, sensor die, micro-electro-mechanical-system (MEMS) die, signal processing die (e.g., digital signal processing (DSP) die), front-end die (e.g., analog front-end (AFE) die), the like, or a combination thereof. In some embodiments, the die 114 has a top cross section (a cross section from the top view of the semiconductor package) in a quadrilateral, a rectangular or a square shape.

Before being adhered to the dielectric layer 108, the die 114 may be processed according to applicable manufacturing processes to form integrated circuits in the die 114. For example, the die 114 includes a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

In some embodiments, the die 114 further includes pads 122, such as aluminum pads, to which external connections are made. The pads 122 are on what may be referred to as respective active surface (e.g., front side) of the die 114. Passivation films 124 are on the die 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the die 114. The die connectors 126 are disposed on the active surface (e.g., front side) of the die 114, and the backside redistribution structure 110 faces the back surface (e.g., backside) of the die 114, which is opposite to the active surface of the die 114.

A dielectric material 128 is on the active surface of the die 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

In some embodiments, the adhesive 116 is attached to a backside of the die 114 and adheres the die 114 to the backside redistribution structure 110, such as the dielectric layer 108 in the illustration. Accordingly, the adhesive 116 is located between the die 114 and the backside redistribution structure 110. The adhesive 116 may be any suitable adhesive, epoxy, die attach film (DAF), or the like. The adhesive 116 may be applied to a backside of the dies 114, such as to a backside of the respective semiconductor wafer or may be applied over the surface of the carrier substrate 100. The dies 114 may be singulated, such as by sawing or dicing, and adhered to the dielectric layer 108 by the adhesive 116 using, for example, a pick-and-place tool.

Figure 6:
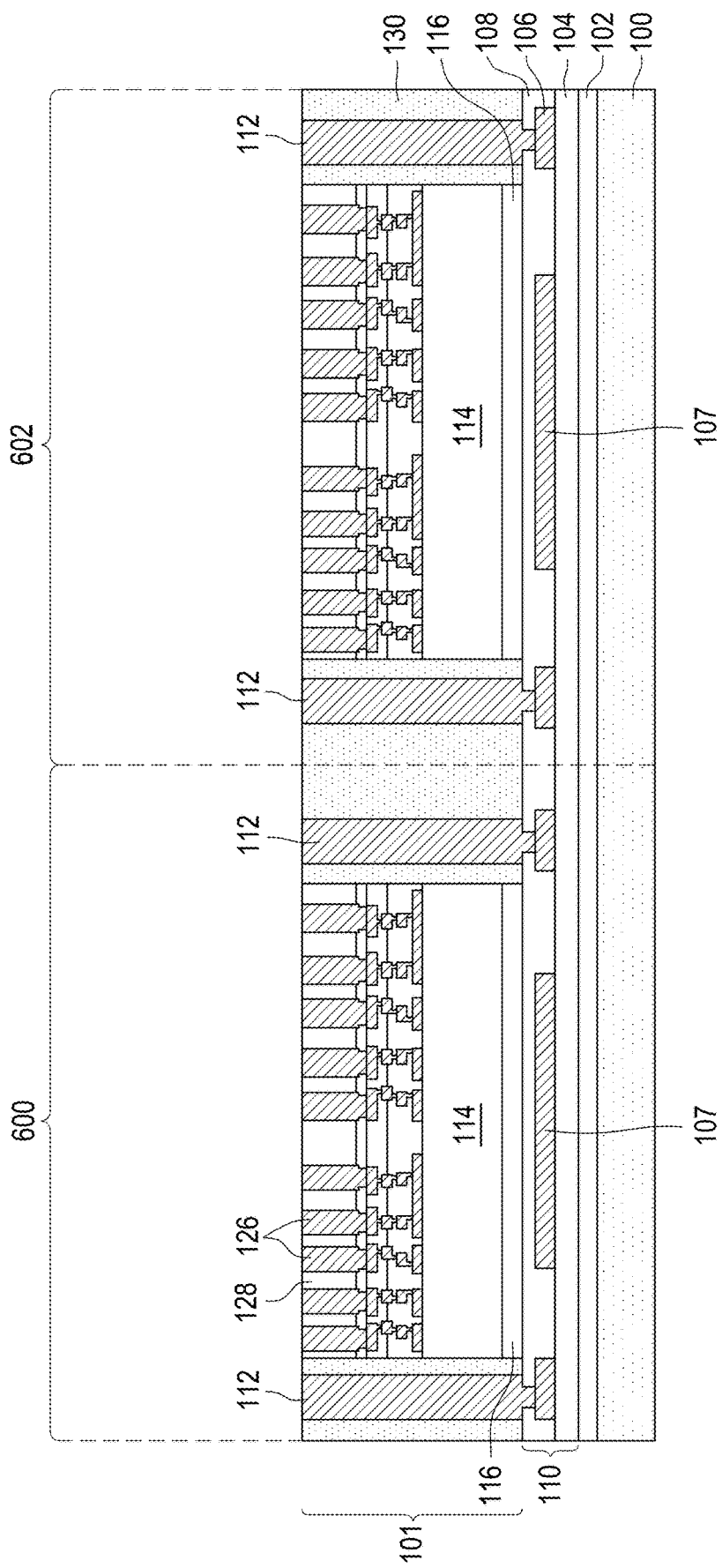

Referring now to FIG. 4 6 an encapsulating material 130 is formed over the dielectric layer 108 to at least laterally encapsulate the die 114 and the through vias 112 (and dummy through vias 113, if applicable). In some embodiments, the molding process is a wafer-level molding process. For example, the encapsulating material 130 is dispensed to fill gaps between the die 114 and the through vias 112. The encapsulating material 130 may include any suitable material such as molding compound, epoxy resin, molding underfill, or the like. Suitable methods for forming the encapsulating material 130 may include compressive molding, transfer molding, liquid encapsulant molding, and the like. For example, the encapsulating material 130 may be dispensed between the die 114 and the through vias 112 in liquid form. Subsequently, a curing process is performed to solidify the encapsulating material 130. The filling of the encapsulating material 130 may overflow the die 114 and the through vias 112 so that the encapsulating material 130 covers top surfaces of the die 114 and the through vias 112. Accordingly, after curing, a mechanical grinding, chemical mechanical polish (CMP), or other etch back technique may be employed to remove excess portions of the encapsulating material 130 and expose the connectors 126 of the die 114 and the through vias 112 (dummy through vias 113, if applicable). After planarization, top surfaces of the encapsulating material 130, the die 114, and the through vias 112 may be substantially level. In some embodiments, the grinding may be omitted, for example, if through vias 112 (dummy through vias 113, if applicable) and die connectors 126 are already exposed. Accordingly, a plurality of through vias 112 (and dummy through vias 113, if applicable) extending through the encapsulating material 130. The through vias 112 are electrically connected to the die 114.

Throughout the description, the resultant structure including the die 114, the through vias 112 and 113 (if any) and the encapsulating material 130 as shown in FIG. 6 is referred to as an encapsulated semiconductor device 101, which may have a wafer form in the process. In some embodiments, the encapsulated semiconductor device 101 may be seen as a substrate 101. Accordingly, in the encapsulated semiconductor device 101, the encapsulating material 130 laterally encapsulates the die 114 and the through vias 112 and 113 (if any), the through vias 112 and 113 (if any) extend through the encapsulated semiconductor device 101 outside the die area where the die 114 is disposed. In other words, the encapsulating material 130 laterally encapsulates the die 110 therein, and the through vias 112 and 113 (if any) extends through the encapsulating material 130. From a structural point of view, as illustrated in FIG. 6, the backside redistribution structure 110 is disposed over a backside of the die 114 and the encapsulating material 130. That is, the backside redistribution structure 110 is disposed over a backside of the encapsulated semiconductor device 101.

Figure 7:
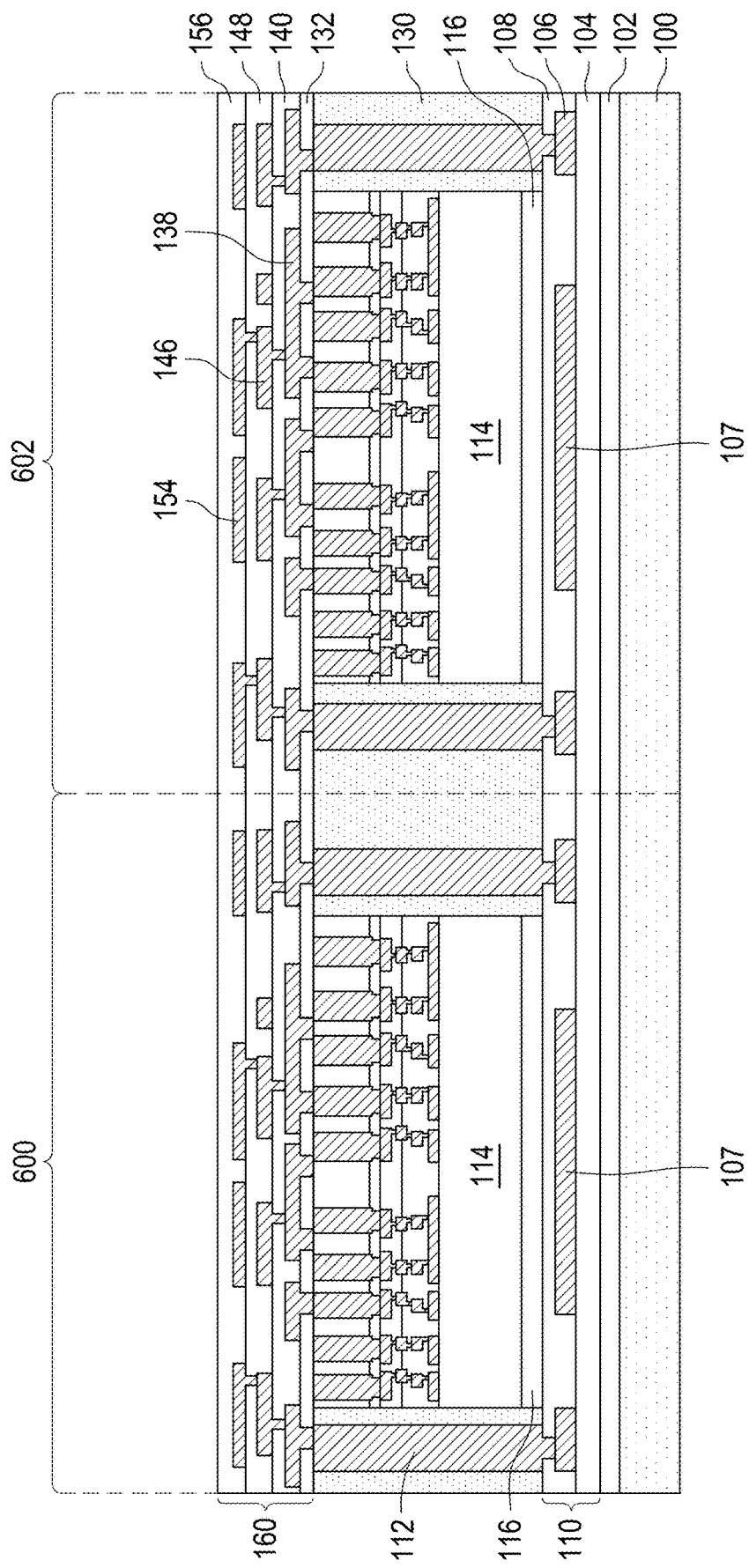

Referring to FIG. 7, a front side redistribution structure 160 is formed. The front side redistribution structure 160 is disposed over a front side of the encapsulated semiconductor device 101, e.g., the front side of the die 114, the through vias 112/113 and the encapsulating material 130, etc. The front side redistribution structure 160 faces the active surface (including die connectors 126) of the die 114 and electrically connected to the die 114 through the die connectors 126. Accordingly, the die 114 can be electrically connected to the functional pads 106 of the backside redistribution structure 110 through, for example, the through vias 112 and the front side redistribution structure 160. As illustrated in FIG. 7, the front side redistribution structure 160 includes dielectric layers 132, 140, 148, and 156 and metallization patterns 138, 146, and 154. The front side redistribution structure 160 may be substantially similar to the backside redistribution structure 110 both in formation process and composition. For example, the front side redistribution structure 160 may include one or more layers of dielectric materials (e.g., dielectric layers 132, 140, 148, and 156) with conductive features (e.g., metallization patterns 138, 146, and 154) formed therein. The one or more dielectric layers may be formed of any suitable material (e.g., polyimide (PI), polybenzoxazole (PBO), BCB, epoxy, silicone, acrylates, nano-filled pheno resin, siloxane, a fluorinated polymer, polynorbornene, an oxide (e.g., silicon oxide), a nitride (e.g., silicon nitride), PSG, BSG, BPSG, or the like) using any suitable method (e.g., a spin-on coating technique, lamination, CVD, sputtering, or the like). The formation of the front side redistribution structure 160 may include patterning the dielectric layers using, for example, photolithography and/or etching processes, and forming conductive features in the patterned dielectric layers by, for example, forming a conductive material in the openings of the patterned dielectric layers.

As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

It is noted that the front side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 8:
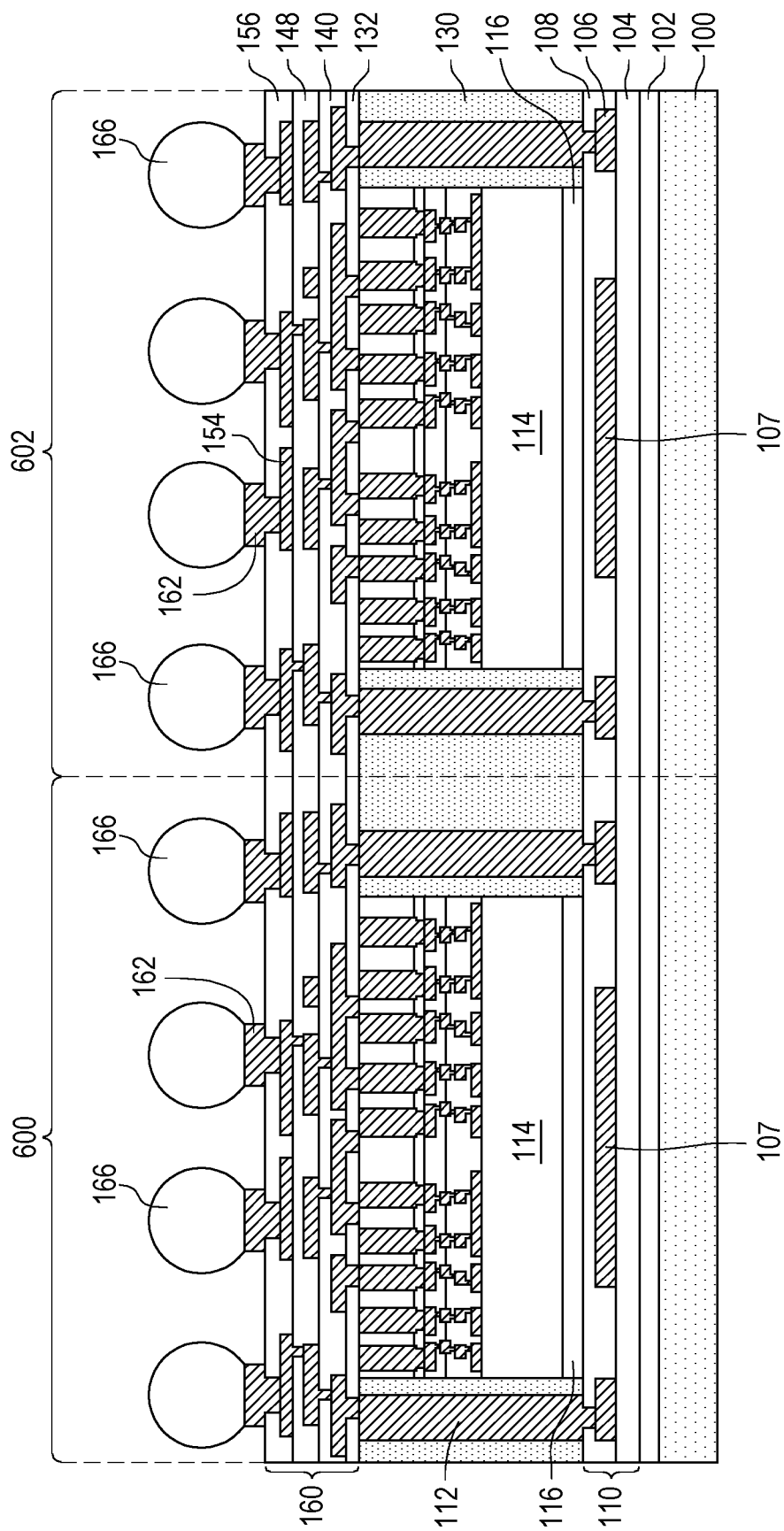

Referring to FIG. 8, the dielectric layer 156 is then patterned. The patterning forms openings to expose portions of the metallization pattern 154. The patterning may be by an acceptable process, such as by exposing the dielectric layer 156 to light when the dielectric layer is a photosensitive material or by etching using, for example, an anisotropic etch. If the dielectric layer 156 is a photosensitive material, the dielectric layer 156 can be developed after the exposure.

Then, pads 162 are formed on an exterior side of the front side redistribution structure 160. The pads 162 are used to couple to conductive connectors 166 (see FIG. 21) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Then, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 9:
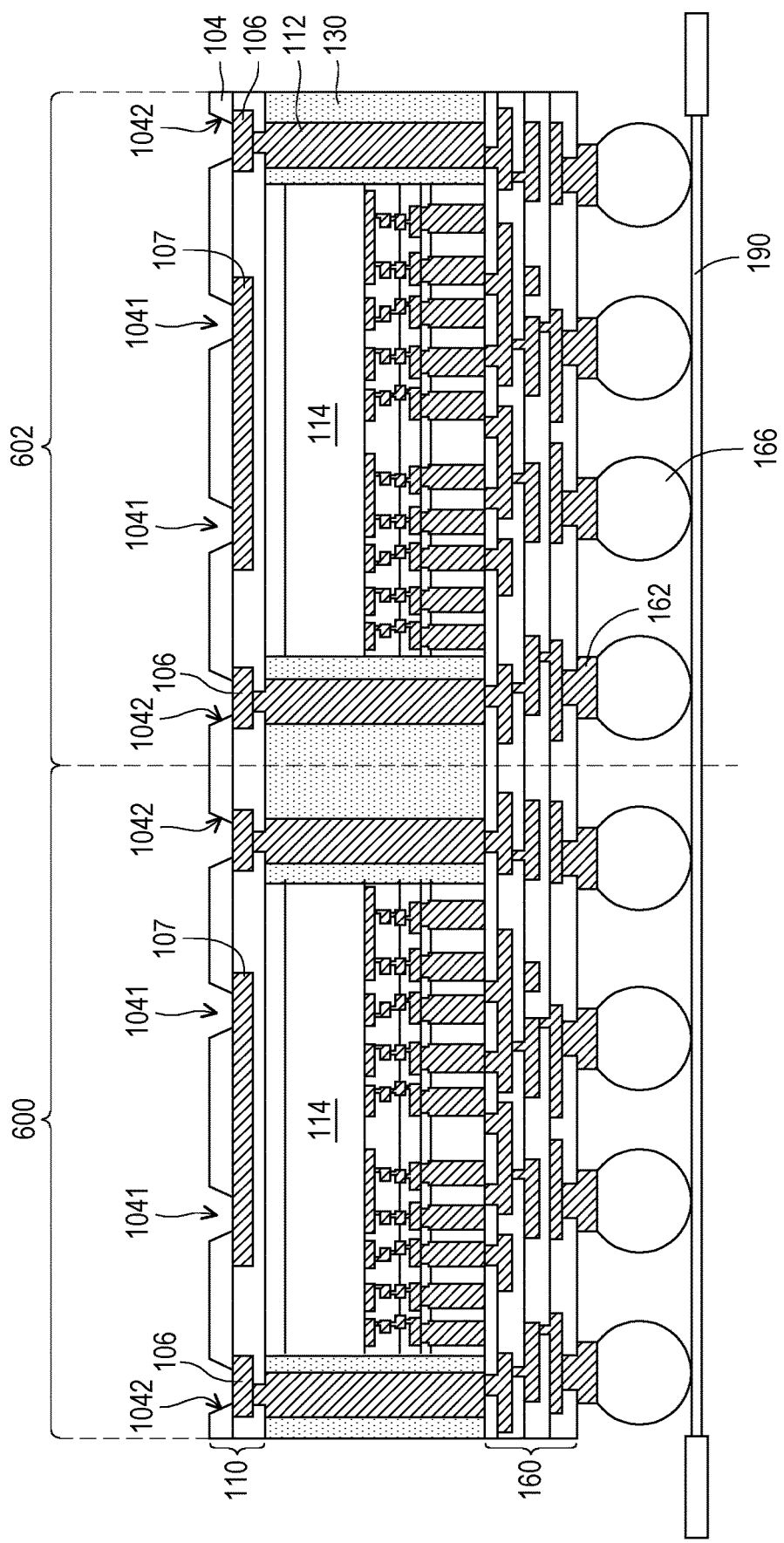

With now reference to FIG. 9, a carrier substrate de-bonding is performed to detach (de-bond) the carrier substrate 100 from the backside redistribution structure, e.g., protective layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 9, in this orientation, the protective layer 104 is disposed over the redistribution circuit layer. Accordingly, the openings 1041, 1042 are formed through the protective layer 104 to reveal the functional pads 106 and a part of the dummy pad portions 107 of the redistribution circuit layer. The openings 1041, 1042 may be formed by using a removal or exposure process such as a laser drilling process. In an embodiment, the laser drilling process may be performed using, e.g., a carbon dioxide (CO2) laser, although any suitable laser may alternatively be used. During the laser drilling process the drill energy may be in a range from 0.1 mJ to about 30 mJ, and a drill angle of about 0 degree (perpendicular to the protective layer 104) to about 85 degrees to normal of the protective layer 104. In some embodiments, the drill time is in a range from about 1 μs to about 150 μs for each of the desired openings 1041, 1042. Due to the nature of dummy pads being isolated from other conductive features, the heat applied to the dummy pads is hard to dissipated when undergoing a thermal process such as laser drilling process described above, which would result in damaging the dummy pads and reduce the reliability of the semiconductor package. Accordingly, as illustrated in FIG. 12, a plurality of dummy pads are integrated into one dummy pad pattern 107 to facilitate the heat dissipation efficiency and reduce the damage to the redistribution circuit layer 110.

Figure 12:
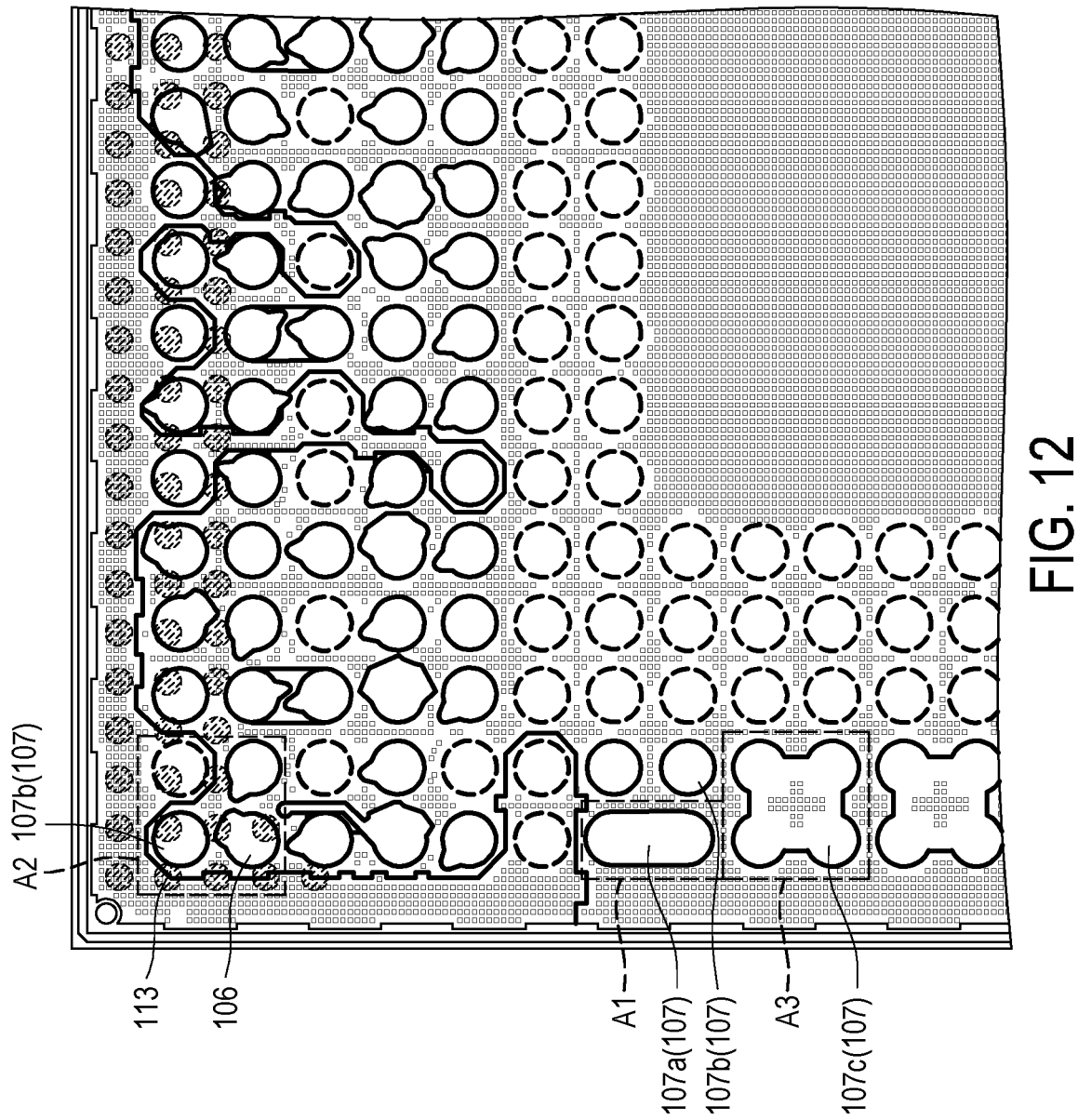
FIG. 12 illustrates a partial top view of an intermediate stage in the manufacturing of a semiconductor package according to some embodiments of the present disclosure.
Figure 14:
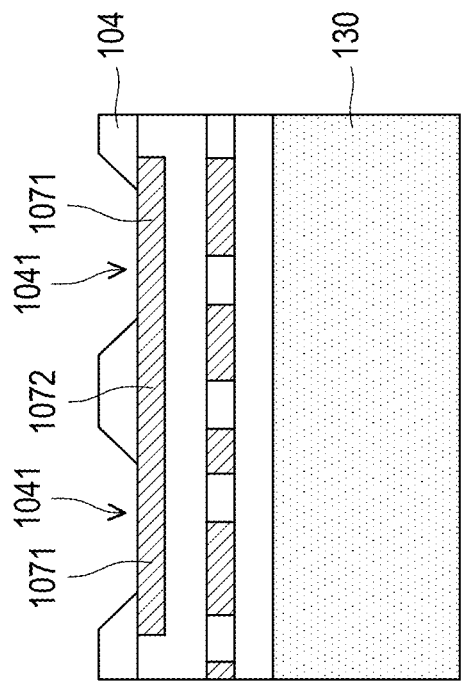
FIG. 14 illustrates a schematic cross sectional view of the semiconductor package in FIG. 13.
Figure 13:
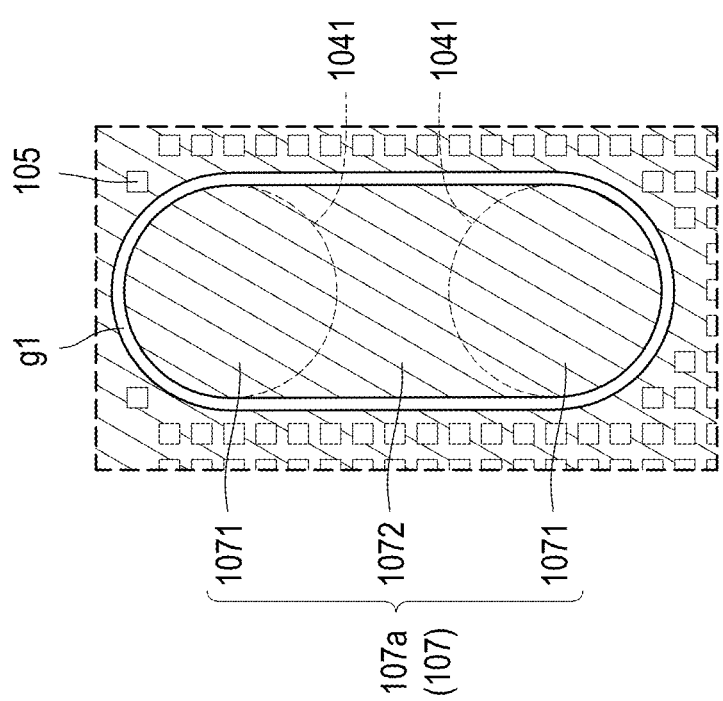
FIG. 13 illustrates a partial enlarged view of the semiconductor package in FIG. 12.

In detail, referring to FIG. 12 to FIG. 14 the dummy pad pattern 107 includes a plurality of pad portions 1071 connected to one another by a connecting portion 1072 in some embodiments. The protective layer 104 includes a plurality of first openings 1041 and a plurality of second openings 1042. The first openings 1041 are spaced apart from one another and revealing the pad portions 1071 respectively, while the second openings 1042 are spaced apart from one another and revealing the functional pads 106 respectively. In some embodiments, the protective layer 104 covers the connecting portion 1072 and reveals the pad portions 1071 by the first openings 1041. In one embodiment, the first openings 1041 and the second openings 1042 may be arranged in an array manner, and may be about the same shape and/or size. That is, the shapes of the first openings 1041 remain the same (e.g., circular shape) regardless various different shapes of the dummy pad patterns 107 underneath.

With such arrangement, adjacent (circular) pad portions 1701 are connected to one another by the connecting portion 1702 to form the dummy pad pattern 107, so that an overall area (footprint) of the dummy pad pattern 107 can be increased, so as to improve the heat dissipation efficiency and reduce damage to the dummy pad pattern 107 from a patterning of the overlying protective layer 104, such as by laser drilling. In the embodiment shown in FIG. 13 and FIG. 14, two adjacent pad portions 1701 are connected to each other by the connecting portion 1702 to form the dummy pad pattern 107a, and the dummy pad pattern 107a is enclosed by an insulating groove g1 to isolate the dummy pad pattern 107a from other conductive features, e.g., redistribution circuits, functional pads 106, etc. The (circular) shape of each of the first openings 1041 may be corresponding to the (circular) shape of each of the pad portions 1701, so the first openings 1041 still define the bonding regions for dummy connectors (e.g., dummy connectors 316) to be disposed therein in the subsequent process. It is noted that the first openings 1041 are illustrated in dashed line in FIG. 13, and the first openings 1041 may be the same as or substantially smaller than the corresponding pad portions 1701.

Figure 16:
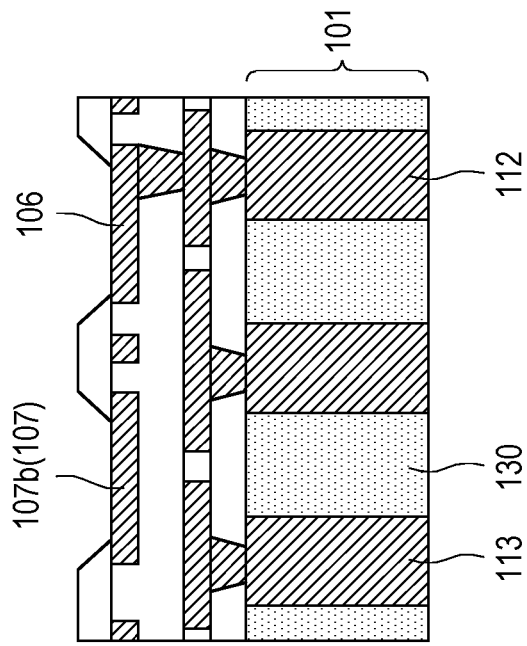
FIG. 16 illustrates a schematic cross sectional view of the semiconductor package in FIG. 15.
Figure 15:
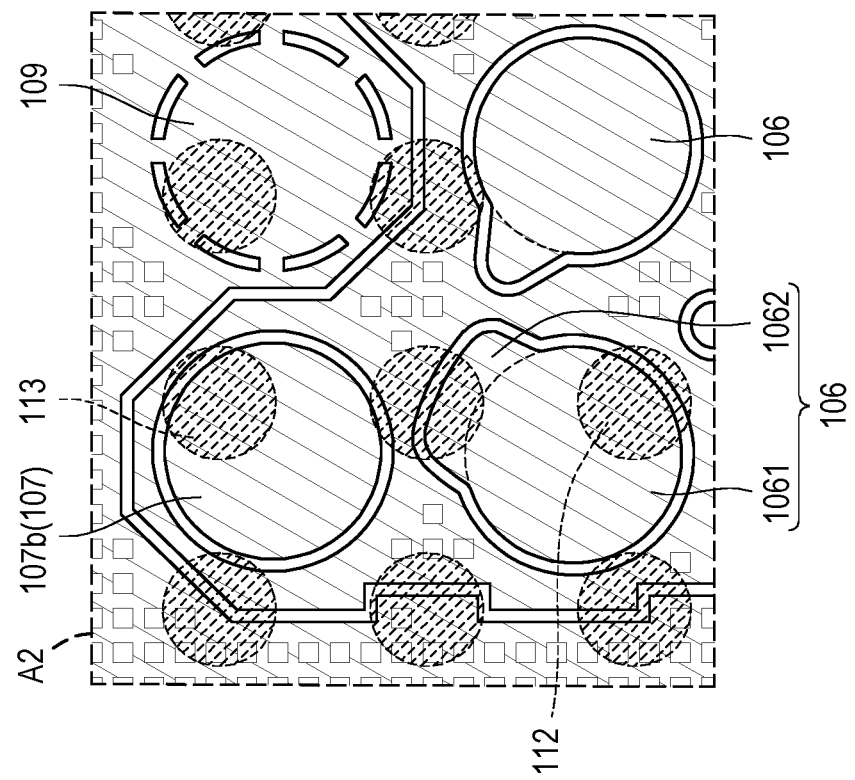
FIG. 15 illustrates a partial enlarged view of the semiconductor package in FIG. 12.

With now reference to FIG. 15 and FIG. 16, in the present embodiment, the encapsulated semiconductor device 101 may include at least one dummy through via 113 extending through the encapsulating material 130 and electrically disconnected from the die 114 and the functional through vias 112. In such arrangement, the location of the dummy through via 113 may at least partially overlap with the dummy pad pattern 107b from a top view as illustrated in FIG. 15. Accordingly, the heat applied to the dummy pad pattern 107b from the thermal process such as laser drilling process may be transmitted to the underlying dummy through via 113, so as to further facilitate the heat dissipation efficiency and reduce the damage to the dummy pad pattern 107b. In one embodiment, the dummy through via 113 may be physically disconnected from the dummy pad pattern 107b, but disposed underneath the dummy pad pattern 107b for thermal coupling. In alternative embodiment, the dummy through via 113 may be physically connected to the dummy pad pattern 107b through other dummy features such as dummy vias, dummy lines, etc.

In the present embodiment, the dummy pad pattern 107b with the dummy through via 113 disposed underneath may be in a circular shape as a normal dummy pad. However, other possible patterns of the dummy pad pattern (e.g., the dummy pad pattern 107a, 107c) may also be applied with the dummy through via 113 disposed underneath for further facilitating the heat dissipation efficiency and reducing the damage to the dummy pad pattern. FIG. 15 also illustrates the grounding pad 109 and the functional pad 106 in different forms. In the embodiment, the functional pad 106 may include a pad portion 1061 and a via portion 1062 connecting to the functional vias underneath, and the functional pad 106 is electrically connected to the functional through vias 112. It is noted that the protective layer 104 is omitted in FIG. 15 for better illustrating the structure underneath.

Figure 17:
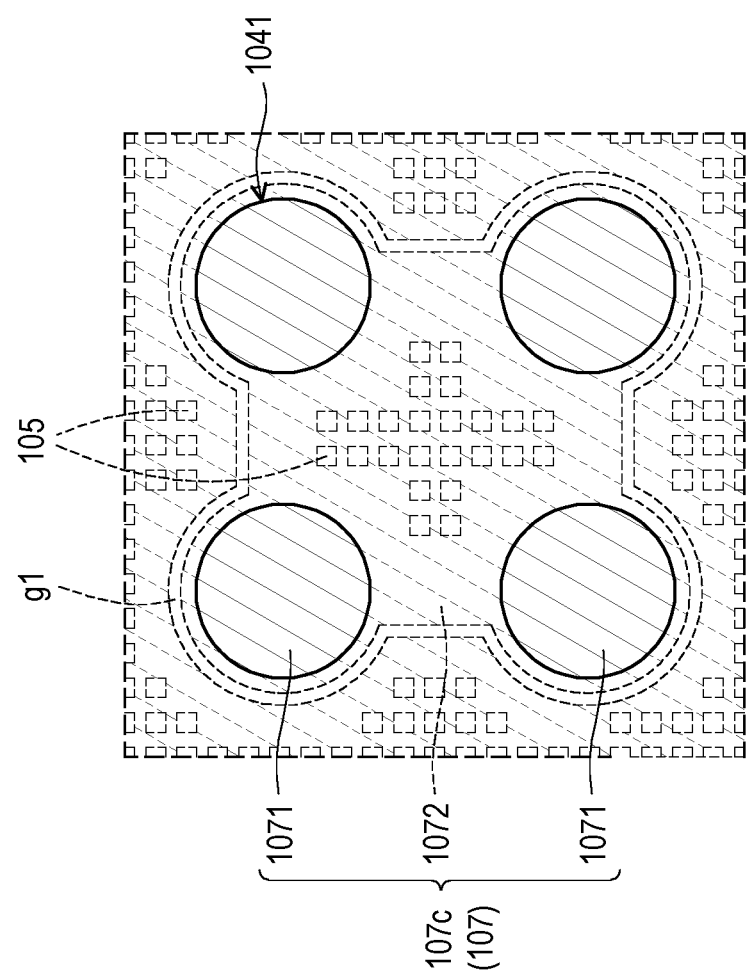
FIG. 17 illustrates a partial enlarged view of the semiconductor package in FIG. 12.

With now reference to FIG. 17, in the present embodiment, four adjacent pad portions 1701 are connected to one another by the connecting portion 1702 to form the dummy pad pattern 107c, and the dummy pad pattern 107c is enclosed (defined) by an insulating groove g1 to isolate the dummy pad pattern 107c from other conductive features. The (circular) shape of each of the first openings 1041 may be corresponding to the (circular) shape of each of the pad portions 1701, so the first openings 1041 still define the bonding regions for dummy connectors (e.g., dummy connectors 316) to be disposed therein in the subsequent process. The dummy pad patterns 107c illustrated above are shown as an example. More or fewer dummy pad portions 1071 may be connected through the connecting portion 1072 to form different dummy pad pattern with different shapes by simply changing the pattern of the photoresist for forming the redistribution circuit layer. It is noted that the protective layer is illustrated in a perspective manner in FIG. 17, so the first openings 1041 are illustrated in solid line while other structures underneath are illustrated in dashed lines for illustration purpose. In some embodiments, the first openings 1041 may be the same as or substantially smaller than the corresponding pad portions 1701.

Because the dummy pad pattern 107 and the functional pad 106 within a redistribution circuit layer may be formed simultaneously, the material of the dummy pad pattern 107 and the functional pad 106 may also be the same. In various embodiments, the dummy pad pattern 107 may include a plurality of mesh openings 105 arranged on the connecting portion 1072 and located between the pad portions 1071. In some embodiments, the mesh openings 105 extend through the dummy pad pattern 107. For example, the dummy pad pattern 107 may include mesh grids having holes disposed in a grid of rows and columns as illustrated in FIG. 17. The mesh openings 105 in the dummy pad pattern 107 may be included to reduce stress induced by the metallization patterns in various dielectric layers of the resulting package. For example, in some embodiments, a total surface area of the mesh openings 105 in a dummy pad pattern 107 may be at least about 30% to about 40% of a total surface of the dummy pattern. It has been observed by including mesh openings 105 having the above areas, stress may be reduced to a suitable level. Thus, manufacturing defects may be reduced and package reliability may be improved. In other embodiments, the mesh openings 105 may occupy a different surface area percentage in relation to a surface area the entire dummy pad pattern 107.

Figure 10:
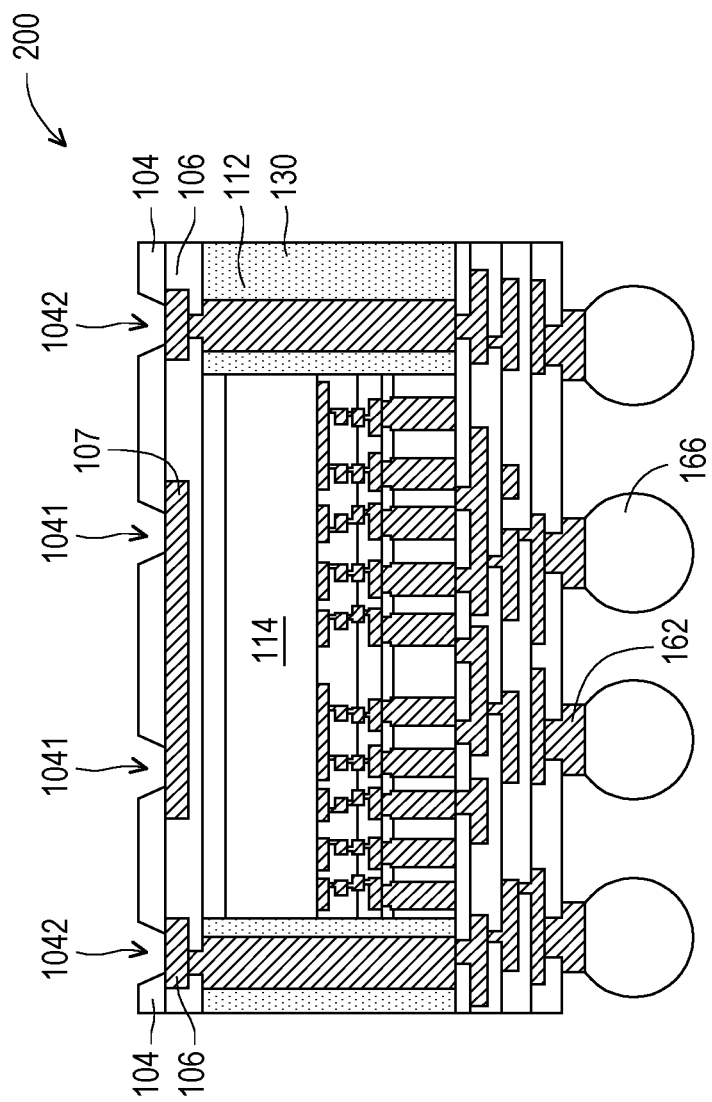

Referring back to FIG. FIGS. 9 and 10, a singulation process is then performed by sawing along scribe line (illustrated as dashed line in FIG. 9), e.g., between adjacent regions 600 and 602. The sawing process singulates the first package region 600 from the second package region 602. FIG. 10 illustrates a resulting, singulated package 200, which may be from one of the first package region 600 or the second package region 602. The semiconductor package 200 may also be referred to as an integrated fan-out (InFO) package 200.

Figure 11:
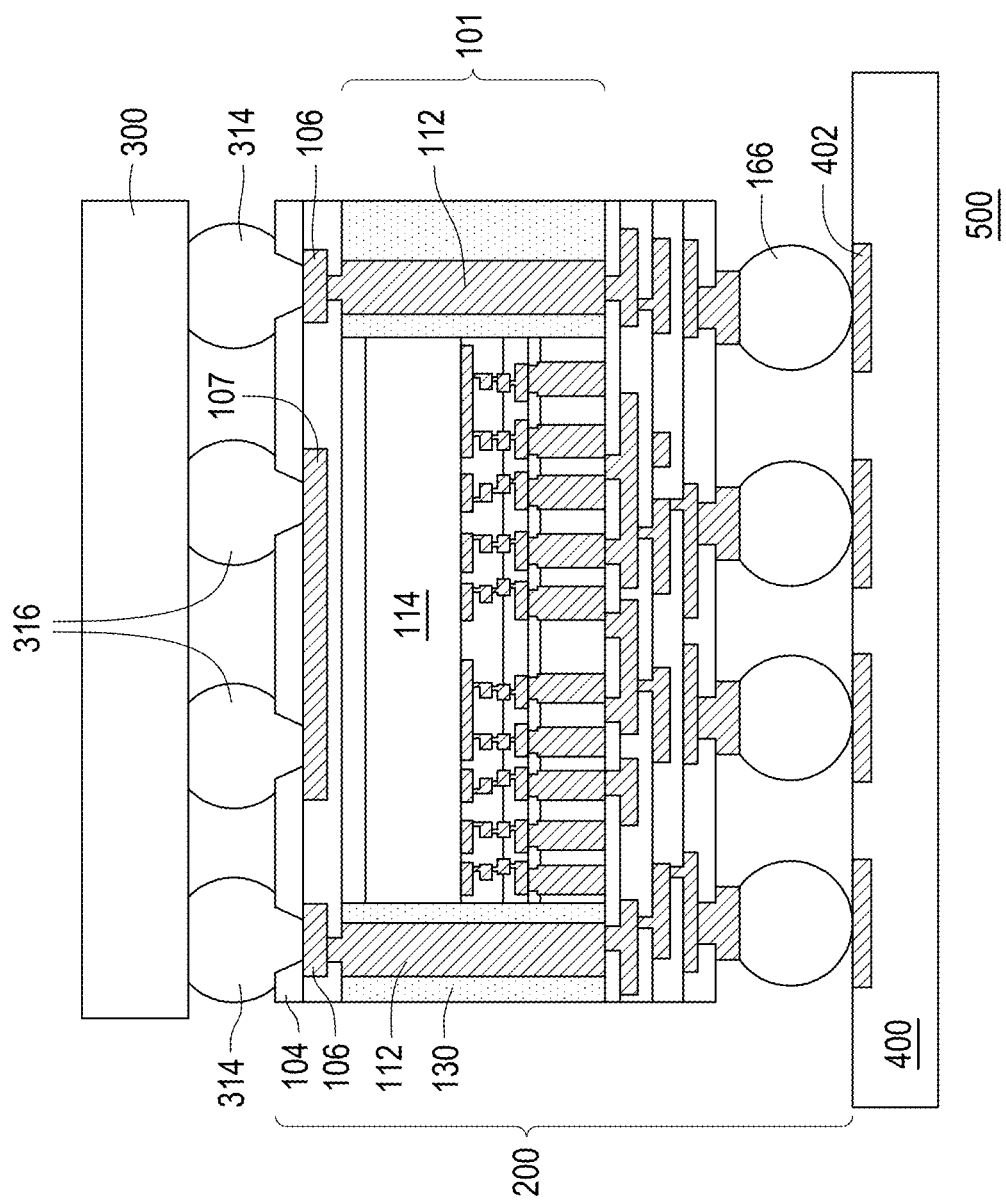

Then, referring to FIG. 10 and FIG. 11, a substrate 300 may be mounted on the first package 200 through a plurality of connectors 314, 316 to form a semiconductor package 500 shown in FIG. 11. The semiconductor package 500 may include the package 200 (may be referred to as a first package 200), a substrate 300, and a substrate 400. In some embodiments, the protective layer 104 with openings (e.g., first openings 1041 and second openings 1042 in FIG. 10) exposes the functional pads 106 and the pad portions 1071 of the dummy pad portions 107. Then, the connector 314, 316 may be disposed in the openings 1041, 1042 and bonded with the functional pads 106 and the dummy pad portions 107 exposed by the openings 1041, 1042 in accordance with some embodiments. In some embodiments, the connectors includes a plurality of functional connectors 314 and a plurality of dummy connectors 316 electrically disconnected from the functional connectors 314. The dummy connectors 316 are disposed in the first openings 1041 and connected to the pad portions 1071 of the dummy pad pattern 107 respectively. The functional connectors 314 are disposed in the second openings 1042 and connected to the functional pads 104 respectively.

In some embodiments, the substrate 300 may be fabricated with a predetermined functional circuit. In some embodiments, the substrate 300 may include a variety of electrical circuits suitable for a particular application. In some embodiments, the electrical circuits include various devices such as transistors, capacitors, resistors, diodes and/or the like. In some embodiments, the substrate 300 may be a chip, a die, or a package. In some embodiments, the substrate 300 has a top cross section (a cross section from the top view) in a quadrilateral, a rectangular or a square shape. In some embodiments, the substrate 300 may include an interposer, a redistribution structures, or other mounting surface, with one or more dies disposed thereon. The substrate 300 is in electrical communication with the functional pads 106 through the functional connectors 314. The connectors 314, 316 may include, for example, solder balls, conductive bumps, pillars, studs, or another conductive structure. In some embodiments, the substrate 300 may include stacked memory dies. For example, the stacked memory dies may include DRAM, SRAMS, flash memories, low-power (LP) double data rate (DDR) memory modules, such as LPDDR1, LPDDR2, LPDDR3, LPDDR4, or the like memory modules. In other embodiments, the substrate 300 may include any one of various known types of semiconductor devices such as microprocessors, application-specific integrated circuits (ASICs), central computing unit (CPU) or the like.

In some embodiments, before bonding the connectors 314, 316, the connectors 314, 316 are coated with a flux (not shown), such as a no-clean flux. The connectors 314, 316 may be dipped in the flux or the flux may be jetted onto the connectors 314, 316. In another embodiment, the flux may be applied to the surfaces of the functional pads and the pad portions of the dummy pad pattern 107. The connectors 314, 316 may have an epoxy flux (not shown) formed thereon before they are reflowed with at least some of the epoxy portion of the epoxy flux remaining after the substrate 300 is attached to the package 200. This remaining epoxy portion may act as an underfill to reduce stress and protect the joints resulting from the reflowing the connectors 314, 316. In some embodiments, an underfill (not shown) may be formed between the substrate 300 and the package 200 and surrounding the connectors 314, 316. The underfill may be formed by a capillary flow process after the substrate 300 is attached or may be formed by a suitable deposition method before the substrate 300 is attached.

In some embodiments, the semiconductor package 500 includes the packages 200 and substrate 300 being mounted to a substrate 400. The substrate 400 may be referred to a package substrate 400. The package 200 is mounted to the package substrate 400 using the conductive connectors 166. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 11). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402.

The conductive connectors 166 electrically and/or physically couple the substrate 400, including metallization layers in the substrate 400, to the package 200. The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Embodiments of the semiconductor package and methods in the current disclosure have many advantages. In particular, adjacent pad portions 1701 are connected to one another by the connecting portion 1702 to form the dummy pad pattern 107, so that an overall area (footprint) of the dummy pad pattern 107 can be increased, so as to improve the heat dissipation efficiency and reduce damage to the dummy pad pattern 107 from a patterning of the overlying protective layer 104, such as by laser drilling. For example, for the embodiment shown in FIG. 15, highest temperature that the dummy pad pattern 107b had reached during the laser drilling process is decreased about 10% to about 15%. For the embodiment shown in FIG. 13, highest temperature that the dummy pad pattern 107a had reached during the laser drilling process is decreased about 30% to about 35%. For the embodiment shown in FIG. 17, highest temperature that the dummy pad pattern 107c had reached during the laser drilling process is decreased about 50% to about 55%. Therefore, by providing the dummy structure adjacent to the redistribution layer, damage to the redistribution layer may be reduced from a patterning of an overlying passivation layer, such as by laser drilling. By connecting adjacent pad portions 1701 by the connecting portion 1702 to form the dummy pad pattern 107, reducing or eliminating the damage to the dummy pad pattern 107 caused by the thermal process may be achieved.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a substrate, a redistribution circuit layer, and a protective layer. The redistribution circuit layer is over the substrate and includes a plurality of functional pads electrically connected to the substrate, and a dummy pad pattern electrically disconnected from the plurality of functional pads, wherein the dummy pad pattern includes a plurality of pad portions connected to one another. The protective layer is disposed over the redistribution circuit layer and comprising a plurality of first openings spaced apart from one another and respectively revealing the plurality of pad portions. In an embodiment, the semiconductor package further includes a plurality of dummy connectors disposed in the plurality of first openings and connected to the plurality of pad portions of the dummy pad pattern. In an embodiment, the protective layer further includes a plurality of second openings separated from one another and respectively revealing the plurality of functional pads. In an embodiment, the plurality of first openings and the plurality of second openings are arranged in an array manner. In an embodiment, the semiconductor package further includes a plurality of functional connectors disposed in the plurality of second openings and connected to the plurality of functional pads respectively. In an embodiment, the dummy pad pattern further includes a plurality of mesh openings disposed between the plurality of pad portions. In an embodiment, the substrate includes a die and encapsulating material at least laterally encapsulating the die and a plurality of through vias extending through the encapsulating material and electrically connected to the die. In an embodiment, the semiconductor package further includes a backside redistribution structure disposed over a backside of the die and the encapsulating material, wherein the backside redistribution structure includes the redistribution circuit layer. In an embodiment, the semiconductor package further includes an adhesive disposed on the backside of the die and located between the die and the redistribution structure. In an embodiment, the semiconductor package further includes a front side redistribution structure disposed over a front side of the die and the encapsulating material.

In accordance with some embodiments of the disclosure, a semiconductor package includes an encapsulated semiconductor device, a backside redistribution structure, and a protective layer. The encapsulated semiconductor device includes an encapsulating material encapsulating a die. The backside redistribution structure is disposed over a backside of the encapsulated semiconductor device and including a redistribution circuit layer, wherein the redistribution circuit layer includes a plurality of functional pads electrically connected to the die, and a dummy pad pattern is electrically disconnected from the plurality of functional pads, wherein the dummy pad pattern includes a plurality of pad portions and a connecting portion connecting the plurality of pad portions. The protective layer is disposed over the redistribution circuit layer, wherein the protective layer covers the connecting portion and reveals the plurality of pad portions and the plurality of functional pads. In an embodiment, the die includes an active surface having a plurality of die connectors and a back surface opposite to the active surface, and the backside redistribution structure faces the back surface of the die. In an embodiment, the semiconductor package further includes a front side redistribution structure disposed over a front side of the encapsulated semiconductor device and facing the active surface of the die. In an embodiment, the encapsulated semiconductor device includes a plurality of functional through vias extending through the encapsulating material and electrically connected to the die. In an embodiment, the dummy pad pattern further includes a plurality of mesh openings arranged on the connecting portion and between the plurality of pad portions.

In accordance with some embodiments of the disclosure, a semiconductor package includes an encapsulated semiconductor device and a redistribution structure. The encapsulated semiconductor device includes an encapsulating material encapsulating a die, a dummy through via extending through the encapsulating material and electrically disconnected from the die. The redistribution structure is disposed over the encapsulated semiconductor device and includes a redistribution circuit layer, wherein the redistribution circuit layer includes a plurality of functional pads electrically connected to the die, and a dummy pad pattern electrically disconnected from the plurality of functional pads, wherein the dummy through via at least partially overlap with the dummy pad pattern from a top view. In an embodiment, the semiconductor package further includes a plurality of functional through vias extending through the encapsulating material, wherein the plurality of functional through vias are electrically connected to the die and electrically disconnected from the dummy through via. In an embodiment, the semiconductor package further includes a protective layer disposed over the redistribution circuit layer and including a plurality of openings revealing the dummy pad pattern and the plurality of functional pads. In an embodiment, the semiconductor package further includes a plurality of dummy connectors connected to the plurality of the dummy pad pattern and a plurality of functional connectors connected to the plurality of functional pads. In an embodiment, the semiconductor package further includes an adhesive attached to a backside of the die and disposed between the die and the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a substrate;
   a redistribution structure over the substrate and comprising a plurality of functional pads electrically connected to the substrate and laterally encapsulated by a dielectric layer, and a dummy pad pattern electrically disconnected from the plurality of functional pads and laterally encapsulated by the dielectric layer, wherein the dummy pad pattern comprises a plurality of pad portions and a connecting portion connecting the plurality of pad portions; and
   a protective layer disposed over the dielectric layer, wherein the protective layer covers the connecting portion and comprises a plurality of first openings spaced apart from one another and respectively revealing the plurality of pad portions.

2. The semiconductor package as claimed in claim 1, further comprising a plurality of dummy connectors disposed in the plurality of first openings and connected to the plurality of pad portions of the dummy pad pattern.

3. The semiconductor package as claimed in claim 1, wherein the protective layer further comprises a plurality of second openings separated from one another and respectively revealing the plurality of functional pads.

4. The semiconductor package as claimed in claim 3, wherein the plurality of first openings and the plurality of second openings are arranged in an array manner.

5. The semiconductor package as claimed in claim 3, further comprising a plurality of functional connectors disposed in the plurality of second openings and connected to the plurality of functional pads respectively.

6. The semiconductor package as claimed in claim 1, wherein the dummy pad pattern further comprises a plurality of mesh openings disposed between the plurality of pad portions.

7. The semiconductor package as claimed in claim 1, wherein the substrate comprises a die and encapsulating material at least laterally encapsulating the die and a plurality of through vias extending through the encapsulating material and electrically connected to the die.

8. The semiconductor package as claimed in claim 7, further comprising a backside redistribution structure disposed over a backside of the die and the encapsulating material, wherein the backside redistribution structure comprises the redistribution circuit layer.

9. The semiconductor package as claimed in claim 7, further comprising an adhesive disposed on the backside of the die and located between the die and the redistribution structure.

10. The semiconductor package as claimed in claim 7, further comprising a front side redistribution structure disposed over a front side of the die and the encapsulating material.

11. A semiconductor package, comprising:
an encapsulated semiconductor device comprising an encapsulating material encapsulating a die;
a backside redistribution structure disposed over a backside of the encapsulated semiconductor device and comprising a redistribution circuit layer, wherein the redistribution circuit layer comprises a plurality of functional pads electrically connected to the die, and a dummy pad pattern electrically disconnected from the plurality of functional pads, wherein the dummy pad pattern comprises a plurality of pad portions, a connecting portion connecting the plurality of pad portions, and a plurality of mesh openings arranged on the connecting portion and located between the pad portions; and
a protective layer disposed over the dielectric layer, wherein the protective layer covers the connecting portion and reveals the plurality of pad portions and the plurality of functional pads.

12. The semiconductor package as claimed in claim 11, wherein the die comprises an active surface having a plurality of die connectors and a back surface opposite to the active surface, and the backside redistribution structure faces the back surface of the die.

13. The semiconductor package as claimed in claim 12, further comprising a front side redistribution structure disposed over a front side of the encapsulated semiconductor device and facing the active surface of the die.

14. The semiconductor package as claimed in claim 11, wherein the encapsulated semiconductor device comprises a plurality of functional through vias extending through the encapsulating material and electrically connected to the die.

15. A semiconductor package, comprising:
an encapsulated semiconductor device comprising an encapsulating material encapsulating a die, a dummy through via extending through the encapsulating material and electrically disconnected from the die; and
a redistribution structure disposed over a backside of the encapsulated semiconductor device and comprising a dielectric layer and a redistribution circuit layer, wherein the redistribution circuit layer comprises a plurality of functional pads electrically connected to the die, and a dummy pad pattern electrically disconnected from the plurality of functional pads, wherein the dummy through via at least partially overlap with the dummy pad pattern from a top view, and the dummy pad pattern is isolated from the dummy through via by the dielectric layer.

16. The semiconductor package as claimed in claim 15, further comprising a plurality of functional through vias extending through the encapsulating material, wherein the plurality of functional through vias are electrically connected to the die and electrically disconnected from the dummy through via.

17. The semiconductor package as claimed in claim 15, further comprising a protective layer disposed over the redistribution circuit layer and comprising a plurality of openings revealing the dummy pad pattern and the plurality of functional pads.

18. The semiconductor package as claimed in claim 15, further comprising a plurality of dummy connectors connected to the plurality of the dummy pad pattern and a plurality of functional connectors connected to the plurality of functional pads.

19. The semiconductor package as claimed in claim 15, further comprising an adhesive attached to a backside of the die and disposed between the die and the redistribution structure.

20. The semiconductor package as claimed in claim 11, wherein a total surface area of the plurality of mesh openings is substantially equal to or greater than 30% of a total surface area of the dummy pad pattern.

* * * * *